(12) United States Patent
Faistauer et al.

(10) Patent No.: US 11,239,010 B2
(45) Date of Patent: Feb. 1, 2022

(54) COMPONENT SUBSTRATE HAVING A PROTECTIVE FUNCTION

(71) Applicant: EPCOS AG, Munich (DE)

(72) Inventors: Christian Faistauer, Frauental (AT); Klaus-Dieter Aichholzer, Deutschlandsberg (AT); Sebastian Brunner, Graz (AT); Edmund Payr, Graz (AT); Günter Pudmich, Köflach (AT)

(73) Assignee: Epcos AG, Munich (DE)

( * ) Notice: Subject to any disclaimer, the term of this patent is extended or adjusted under 35 U.S.C. 154(b) by 374 days.

(21) Appl. No.: 16/061,801

(22) PCT Filed: Oct. 18, 2016

(86) PCT No.: PCT/EP2016/074977
§ 371 (c)(1),
(2) Date: Jun. 13, 2018

(87) PCT Pub. No.: WO2017/121505
PCT Pub. Date: Jul. 20, 2017

(65) Prior Publication Data
US 2019/0013120 A1    Jan. 10, 2019

(30) Foreign Application Priority Data
Jan. 14, 2016 (DE) .................. 10 2016 100 585.1

(51) Int. Cl.
*B23P 19/00* (2006.01)
*H01C 7/12* (2006.01)
(Continued)

(52) U.S. Cl.
CPC ............. *H01C 7/123* (2013.01); *H01C 1/034* (2013.01); *H01C 1/14* (2013.01); *H01C 7/102* (2013.01); *H01L 23/60* (2013.01); *Y10T 29/5313* (2015.01)

(58) Field of Classification Search
CPC . H01L 2924/12044; H01L 2924/12041; H01L 33/647; H01L 25/167; G09G 3/14;
(Continued)

(56) References Cited

U.S. PATENT DOCUMENTS 7,528,422 B2    5/2009 Murphy
10,128,175 B2 *  11/2018 Lin ..................... H01L 21/561
(Continued)

FOREIGN PATENT DOCUMENTS

DE    102012101560 A1    5/2013
DE    102012107668 A1    3/2014
(Continued)

OTHER PUBLICATIONS

International Search Report in International Application No. PCT/EP2016/074977, dated Jan. 31, 2017 (2 pages).

*Primary Examiner* — Thiem D Phan
(74) *Attorney, Agent, or Firm* — Nixon Peabody LLP (57) ABSTRACT

A mechanically stable main body having a cutout, into which an ESD protection element is at least partly embedded and mechanically fixed by means of a connection means. Electrical terminals of the protection element are connected to terminal pads on the top side of the main body by way of a structured metallic layer bearing on main body and protection element.

9 Claims, 4 Drawing Sheets

(51) Int. Cl.
*H01C 1/034* (2006.01)
*H01C 1/14* (2006.01)
*H01C 7/102* (2006.01)
*H01L 23/60* (2006.01)

(58) Field of Classification Search
CPC ............ H02H 3/20; H02H 7/20; H02H 9/046; H05K 1/0259; H05K 2201/0738; H05K 2201/10106; Y10T 29/5313
USPC ............... 29/729, 25.01, 623, 709, 739, 745
See application file for complete search history.

(56) References Cited

U.S. PATENT DOCUMENTS

| | | | |
|---|---|---|---|
| 2007/0075323 | A1 | 4/2007 | Kanazawa |
| 2009/0316315 | A1 | 12/2009 | Wang |
| 2012/0112237 | A1 | 5/2012 | Zheng |
| 2014/0301054 | A1 | 10/2014 | Nagai et al. |
| 2015/0084080 | A1* | 3/2015 | Kawakita ................ H01L 33/60 257/98 |

FOREIGN PATENT DOCUMENTS

| | | |
|---|---|---|
| EP | 2816622 A1 | 12/2014 |
| JP | H 01-99227 A | 4/1989 |
| JP | 2008147270 A | 6/2008 |
| JP | 2012015438 A | 1/2012 |
| JP | 2013122951 A | 6/2013 |

* cited by examiner

Fig 14

COMPONENT SUBSTRATE HAVING A PROTECTIVE FUNCTION

CROSS-REFERENCE TO RELATED APPLICATIONS

This application is a U.S. National Stage of International Application No. PCT/EP2016/074977, filed Oct. 18, 2016, which claims the benefit of German Patent Application No. 102016100585.1, filed Jan. 14, 2016, both of which are incorporated herein by reference in their entireties.

The application relates to a substrate having a protective function for an electrical component and a small structural height.

Varistors can be used for protecting sensitive installations, components and networks against ESD (electrostatic discharge). Varistors are nonlinear components whose resistance decreases greatly when a specific applied voltage is exceeded. Varistors are therefore suitable for harmlessly dissipating overvoltage pulses. Varistors comprising a zinc oxide ceramic having a grain structure are produced.

Varistors can be integrated in multilayer ceramics only with high outlay and are therefore usually used as discrete components.

Discrete varistors, by contrast, essentially have geometric advantages; by way of example, they can be made very thin. However, this increases the risk of breaking for the panels.

Discrete components having a varistor function or generally having an ESD protective function are directly soldered onto a ceramic surface, a leadframe, a circuit board or a printed circuit board and electrically connected to the component to be protected.

It is also possible to integrate such protection elements into a laminate during the production thereof.

Furthermore, it is possible to position the protection element in a cutout of the substrate, of the carrier plate or of the laminate such that it is adjacent to other electrically conductive structures provided for connection to further components. Although this results in a small component height, it requires sufficient placement area.

It is also possible to use a varistor ceramic as a component substrate and to integrate the protective function into the substrate.

It is an object of the present invention to further improve the integration of a protective function or of a protection element into an electrical component.

This object is achieved by means of a carrier plate having the features of claim 1. Advantageous configurations of the invention and also a method for producing a carrier plate can be gathered from further claims.

A carrier plate is proposed which comprises a mechanically stable main body, such as is customary for instance for known carrier plates. Provision is made of external contacts on the underside of the main body and terminal pads for the component on the top side.

For the positioning of an ESD protection element, according to the invention a cutout is provided, into which the ESD element is at least partly embedded. In this case, the electrical terminals of the protection element are accessible from the top side or the underside of the main body. In an alternative embodiment, the protection element is electrically conducted at the bottom of the cutout. The electrical connection between the protection element and the component can then be effected by way of a metallization extending internally in the main body. It is also possible to lead corresponding terminals by way of vias onto the surface of the main body.

The protection element is mechanically fixed in the cutout by means of a connection means. The fixing can be performed at just a few points.

The protection element is electrically connected to the terminal pads on the top side or the external contacts on the underside of the main body by way of a structured metallic layer.

Such a carrier plate has the advantage that the protection element can be embedded into the main body without great technical outlay. The connection means can be chosen such that it serves solely for mechanically fixing the protection element in the cutout. Preferably, a connection means is chosen which is compatible with later process techniques, in particular during the later mounting of a component onto the terminal pads, in particular by soldering.

The connection means thus functions like an adhesive which undergoes a liquid or viscous phase at least once before or during the fixing of the protection element in the cutout. It is not necessary for the connection means to fill all the remaining interspaces between the protection element and the outer walls of the cutout. It is sufficient to fix the protection element in the cutout with the connection means, which can be effected by way of securing at a few points.

By means of the at least partial embedding of the protection element into the main body, the total height of the carrier plate is not increased or is increased only insignificantly. Moreover, it is possible thereby to provide flush surfaces between main body and protection element, to which a structured metallic layer for electrically connecting protection element and terminal pads can be implemented in a simple manner. Such a structured metallic layer can also be applied in a simple manner over the two surfaces of main body and protection element if just a small step height for the two surfaces is to be overcome.

The arrangement of the protection element in the cutout has the further advantage that the positioning of the protection element can be effected with high tolerance and need not be performed with an accurate fit. In addition, by means of a suitably chosen material having good thermal conductivity for the main body, it is possible to realize overall just a low thermal resistance of the combination of main body+protection element.

The protection element can be an arbitrary component designed for dissipating overvoltages. Preferably, the protection element is a varistor, but can also be a zener diode, a TVS component or some other nonlinear component.

A varistor is preferred because, firstly, it has a good dissipation function over a relatively small component volume. Secondly, a varistor is cost-effective and highly miniaturizable, such that the total volume of the carrier plate does not increase, or increases only insignificantly, as a result of the embedded protection element.

The connection means can be electrically insulating or electrically conductive. It is selected from a plastic, a ceramic material, glass or metal or comprises such a material. Preference is given to ceramic materials which can be used in paste form and finally incorporated by sintering. A glass frit is suitable, too, which is suitable for securely fixing the protection element by means of the glass being melted. A metallic connection means can be a solder, for example, the melting point of which is set correspondingly highly to withstand the later mounting of the component on the terminal pads or not to melt again under these conditions or at least to be held in position during melting by means of self-centering (self-alignment by means of surface tension). However, the connection means can also be a plastic which can be selected with corresponding thermal and process stability, for example an epoxy resin or polyimide.

Particularly simple production is accomplished if the outwardly facing surface of the protection element terminates flush with a surface of the main body. In that case the metallic layer can bear on both surfaces without step formation and can therefore be applied in a particularly simple manner.

The protection element can terminate with the top side of the main body and be electrically connected to the terminal pads on the top side. It is also possible, however, for the protection element to terminate with the underside of the main body and then to be connected to the external contacts of the main body by way of the structured metallic layer. Since external contacts and terminal pads are electrically connected to one another at least via plated-through holes, an interconnection of the protection element with the external contacts is equivalent to an interconnection with the terminal pads on the top side of the main body.

External contacts and terminal pads can be directly connected via plated-through holes. It is also possible, however, to provide a multilayered main body having at least one internal metallization plane. The metallization plane can be structured to form a wiring plane in which interconnections between different terminal pads and/or external contacts are provided. The wiring plane can be provided for interconnecting with one another different components that are mountable on the surface of the carrier plate.

It is also possible to integrate components into the multilayered construction of the main body by virtue of the wiring plane being correspondingly structured to form conductor sections for integrated resistances, to form metallized areas for integrated capacitances or to form, if appropriate, curved or spiral conductor sections for realizing integrated inductances. Individual layers of the multilayered main body can each comprise different dielectrics suitable for the integrated passive components.

The arrangement of the cutout on the surface of the carrier plate can be effected in any desired way. Preferably, however, the cutout is provided between the terminal pads for the component or, even more advantageously, below the terminal pads for the component. A component which is to be mounted later and which is seated on at least two terminal pads is then arranged at least partly above the protection element. This is accomplished on account of the fact that the protection element is recessed into the main body to a sufficient depth such that the projection of the protection element above the surface of the main body maximally corresponds to the distance of the component above the surface of the main body and therefore does not impede the mounting of the component.

In one advantageous embodiment, the terminal pads of the carrier plate are formed from the structured metallic layer and can then be directly applied above the protection element and the adjacent surface of the main body. In this way, the protection element does not require additional surface area on the main body, with the result that a laterally adjacent arrangement of protection element and component is not necessary and the basic area thereof can be saved.

The cutout is configured such that it can receive at least the basic area of the protection element. If the basic areas of protection element and cutout are optimally adapted to one another, then this results in a minimum area requirement for the cutout and/or for the protection element. A further advantage of an optimum adaptation is the simple fixing which requires only a small amount of connection means or only few connection points in conjunction with low tolerance.

It is also possible, however, to fashion the cutout such that it can be produced technically with little outlay. In a simple manner, the cutout is introduced by e.g. sawing or milling. In a particularly simple manner, a trench extending over the entire main body can be produced by sawing into the main body. Although the latter has a larger basic area than the protection element, in return it can be produced in a particularly simple manner and with high tolerance.

A cutout which is laterally enclosed by the main body on four sides is preferred with regard to mechanical strength.

If the depth of the cutout is smaller than the thickness of the main body, then the protection element can also be seated on the bottom of the cutout. It is also possible, however, for the cutout to extend vertically through the entire main body. Such a cutout can be produced by drilling, milling, etching or by thermal treatment, for example by means of a laser.

A carrier plate can be produced particularly cost-effectively in the panel. To that end, the carrier plate comprises a multiplicity of component regions having corresponding terminal pads and at least one cutout in each case. A protection element is then provided in each cutout, such that the carrier plate later is able to be singulated into a multiplicity of individual carriers, on each of which a component region for one or a plurality of components is provided.

At least the production of the cutout and the application of the structured metallic layer can then be performed easily in an integrated manner for the entire large-area carrier plate. The placement of protection elements is likewise facilitated on a large-area carrier plate.

In order to produce a carrier plate according to the invention, a crystalline, ceramic, metallic or vitreous main body is provided. The main body can also have a layer construction in which different materials are processed for the individual layers.

In the next step, a cutout for receiving a protection element is produced in a surface of the main body. As stated, this can be effected by drilling, milling, etching, sawing or thermal material removal. Afterward, a protection element is embedded at least partly into the cutout and mechanically fixed by means of a connection means. The fixing can comprise a thermal step in which the connection means is melted, sintered or thermally hardened.

In the next step, a structured metallic layer bearing on the surface of main body and protection element is produced. This can be followed by the production of electrical terminal pads for the component on the top side of the main body.

The structured metallic layer can be applied such that it overlaps the terminals of the protection element and the terminal pads on the main body and in this case electrically conductively connects them. Alternatively, the structured metallic layer is applied above the terminals of the protection element and configured in the process or later to form terminal pads for the later application of the component.

In one method variant, the protection element, after fixing in the cutout and before application of the structured metallic layer, is ground away from the top side to an extent until the top side of the protection element terminates flush with the top side of the main body. This variant has the advantage that, firstly, the exact depth of the cutout is noncritical and can even be smaller than the height of the protection element. Secondly, this variant has the advantage that the protection element can initially be present with a thickness enabling it to be processed mechanically stably and securely.

After fixing in the cutout, the protection element is then mechanically fixed so well that the loss of stability that should actually be expected as a result of the grinding away does not take effect. The protection element can then be ground away to a height at which it would no longer be handleable or would no longer be mechanically stable as an individually processable component. The volume required for the protection element is minimized as a result. The mechanical stability of the main body is also impaired to a lesser extent by the production of the cutout having a smaller depth in comparison with a cutout required for receiving a protection element having a conventional structural height. Of course, the advantage of planar and flush terminating surfaces of main body and protection element is also achieved in this case.

The structured metallic layer can be applied on flush surfaces in a simple manner. According to the invention, producing said layer comprises at least one of the following steps:
a) printing an electrically conductive compound,
b) firing an electrically conductive paste,
c) applying a basic metallization from the gas phase, e.g. by vapor deposition or sputtering,
d) electrolytically reinforcing a basic metallization,
e) jet printing an ink containing electrically conductive particles.

The printing in accordance with method variant a) can be carried out by means of screen printing, for example. The paste can inherently already be electrically conductive and be converted into the final structured metallic layer by hardening. It is also possible, however, to fire the printed compound in accordance with method step b) and in the process to remove a binder or to connect possibly contained electrically conductive particles by sintering with one another. A coarsely structured metallization can also be finely structured by laser ablation.

A purely metallic structured layer can comprise a first substep, in which a basic metallization is applied from the gas phase, as in method step c). The latter can be reinforced in accordance with method step d) electrolytically or in an electroless manner. In this case, the structuring can already be carried out on the basis of the basic metallization, either by surface regions that are not to be metallized being freed of the basic metallization; or alternatively, the basic metallization and/or in particular the later reinforcement are/is applied in a masked manner, such that the metallic layer is structured to completion after the removal of the mask.

The application methods by means of printing in accordance with variants a) and e) already result in a corresponding structuring by virtue of the printing process. One preferred application by printing can be effected by jet printing. In this case, fine droplets of an ink containing electrically conductive particles are applied to the surface by spin-coating using a corresponding print head. Jet printing can be carried out with high structural accuracy, with the result that the structured metallic layer likewise obtains a high structural accuracy. The thickness of the printed layer can also be influenced by way of the advance speed of the print head. It is also possible to pass multiply over the surface regions to be coated and thereby to increase the layer thickness of the printed layer.

The invention is explained in greater detail below on the basis of exemplary embodiments and with reference to the associated figures. The figures have been drawn purely schematically and therefore not as true to scale. For better clarity, individual parts may also be omitted in the figures. Identical or identically acting parts are provided with identical reference signs.

Figure 1:
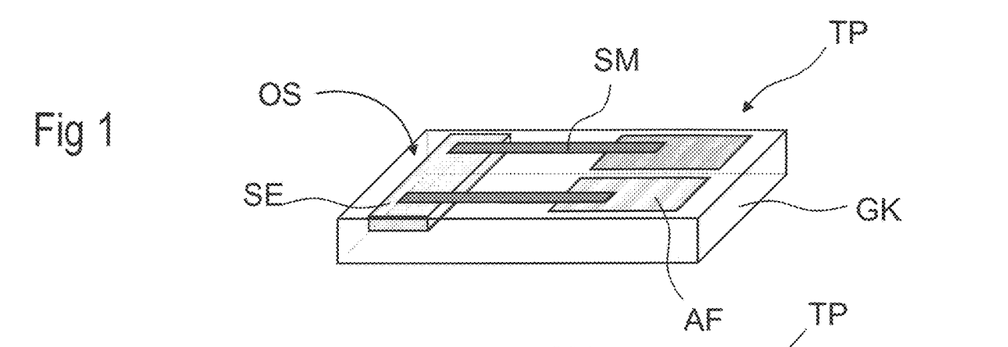
FIG. 1 shows, in a schematic perspective plan view, a carrier plate in which the protection element is arranged in a cutout adjacent to the terminal pads.

FIG. 1 shows a carrier plate TP according to the invention in a perspective plan view. It comprises a main body GK produced from a mechanically stable material, in particular from a ceramic. The main body GK can be configured in a multilayered fashion. It has, on the top side, terminal pads AF for a component to be mounted later. On the underside, said main body has external contacts connected to the terminal pads AF via plated-through holes (not illustrated in the figure). An ESD protection element SE is arranged in a cutout on the top side of the main body and fixed there. The terminals of the protection element SE (not illustrated in the figure) are electrically conductively connected to the adjacent terminal pads AF on the main body GK by way of a structured metallization SM. Depending on the embodiment with and without internal electrodes, a protection element configured as a varistor can have dimensions of, for example, 466×446×80, 250×250×100, or, in the ultra-small embodiment, 250×100×80 μm.

In the embodiment shown, the structured metallization SM is embodied as a separate element. It is also possible, however, to form terminal pads AF and the structured metallization from the same metallic layer in a common method step. It is also possible to produce firstly the structured metallic layer SM and only then the terminal pads AF.

The cutout that receives the protection element SE is not illustrated separately here. At all events it is large enough to at least partly receive the protection element SE, such that the latter is recessed at least partly in the surface of the main body GK. Preferably, the protection element SE is completely embedded into the main body GK.

Although the protection element SE is arranged in a cutout introduced on the top side OS of the main body GK in the illustrated embodiment in FIG. 1, in a modification said protection element can also be arranged in a cutout introduced in the underside of the main body GK. By way of a structured metallization, the protection element is then connected to the external contacts on the underside, which are in turn connected via plated-through holes to the terminal pads AF on the top side of the main body GK.

Figure 2:
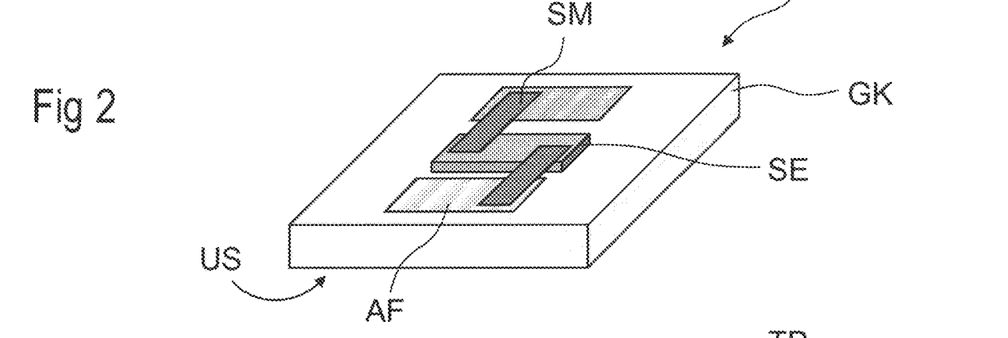
FIG. 2 shows, in a schematic perspective plan view, a carrier plate in which a protection element is arranged between two terminal pads.

FIG. 2 shows a further embodiment, wherein the cutout with the protection element SE is arranged between two terminal pads AF on the top side of the main body GK. Here, too, the terminals of the protection element SE are electrically conductively connected to the terminal pads AF by way of a structured metallic layer SM. Here, too, it holds true that structured metallic layer and terminal pads AF are applied separately in terms of production and material, or alternatively as an integral structured metallic layer this simultaneously forms the terminal pad for the later component. Here, too, it is possible to allow the top side of the protection element SE to project above the top side of the main body GK, provided that the projection is small enough that it does not impede the later securing of a component BE on the terminal pads AF. If a bump connection is used for this purpose, then a projection can be up to a few 10 µm. In one exemplary embodiment, a bump including terminal pad has a total height of approximately 70 µm, such that the protective component could project above the surface of the main body up to a height of just less than said 70 µm.

Figure 3:
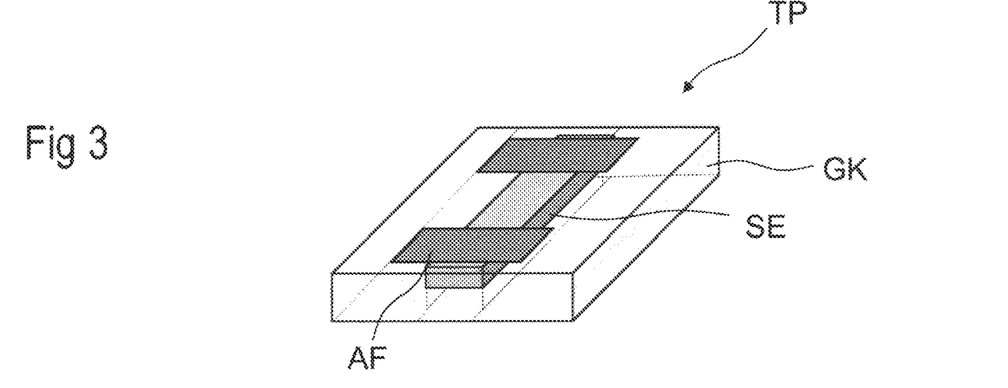
FIG. 3 shows, in a schematic perspective plan view, a carrier plate in which the protection element is arranged below the terminal pads.

FIG. 3 shows a further embodiment, wherein the cutout with the protection element SE is arranged below the terminal pads AF. In the embodiment illustrated, the protection element SE is oriented transversely with respect to the terminal pads, but can form any arbitrary mixed form of partial or complete overlap, without deviating from the invention. In this case it is clear that the terminal pads AF can be introduced into the cutout only after the protection element has been introduced and fixed, such that the structured metallic layer is applied over the protection element SE and parts of the main body GK in the form of two or more terminal pads.

While the embodiments in accordance with FIGS. 1 to 3 comprise cutouts adapted to the size of the protection element SE, the cutout AN can also deviate greatly from the size of the protection element SE, e.g. with regard to length, width and depth of the cutout.

Figure 4:
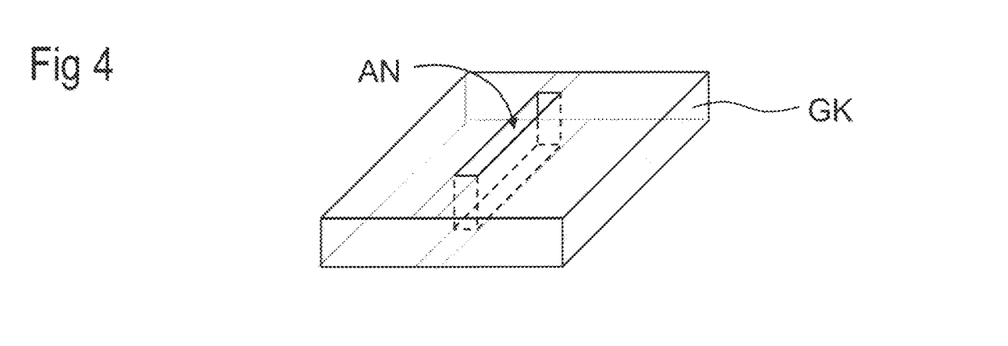
FIG. 4 shows a perspective view of a main body having a through going cutout.

FIG. 4, for example, shows a main body GK having a centrally provided cutout AN extending from the top side through the main body as far as the underside of the main body. Such an embodiment has the advantage that an area-saving embodiment is obtained in conjunction with sufficient mechanical stability of the main body and sufficient miniaturizability of the protection element SE. Although the cutout is embodied here with vertical sidewalls and right-angled edges, in a departure therefrom it can also have oblique sidewalls and rounded or differently shaped corners.

Figure 5:
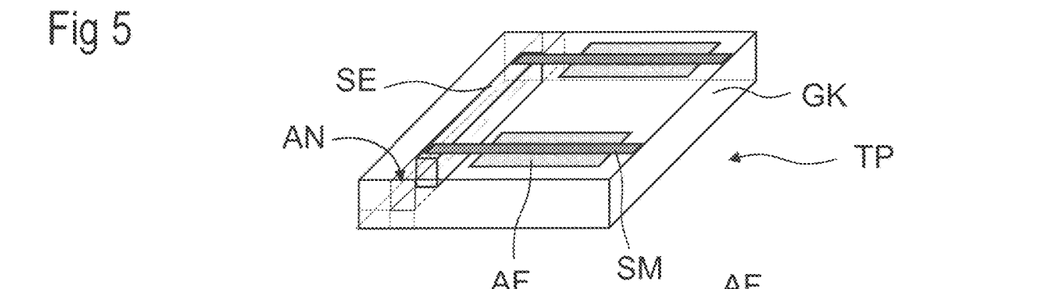
FIG. 5 shows, in a schematic perspective plan view, a carrier plate with protection element arranged in a trench and adjacent to terminal pads.

FIG. 5 shows a further embodiment, wherein a method that can be carried out in a particularly simple manner can be used for producing the cutout AN. The cutout AN here is embodied as a trench extending transversely over the main body GK with uniform width and depth. Such a trench or such a trench-type cutout AN can be produced in a simple manner with the aid of a milling machine or a saw blade. Rectangular trench cross sections adapted to the external dimensions of the protection element SE can also be produced in a simple manner using a saw blade. The protection element itself does not extend over the entire length of the trench, but rather is aligned in a manner appropriately matching the terminal pads AF, to which it is electrically connected by way of a structured metallic layer SM. Here, too, structured metallic layer SM and terminal pads AF can consist of the same material and also of a uniform layer.

Figure 6:
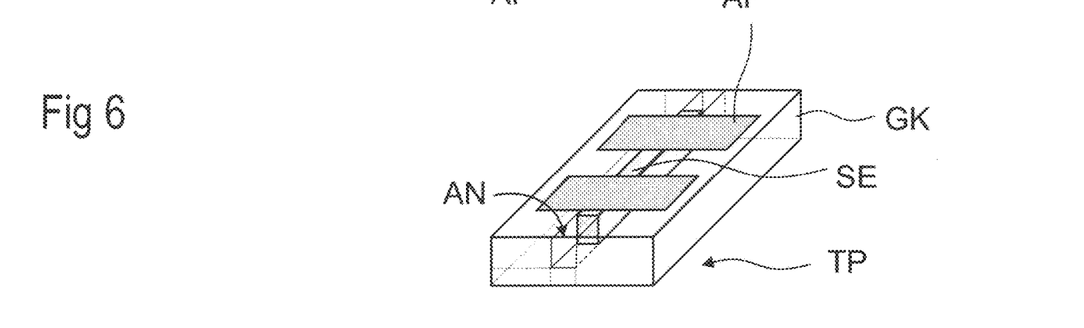
FIG. 6 shows a carrier plate having a trench-type cutout below the terminal pads.

The embodiment in accordance with FIG. 6 differs from the embodiment according to FIG. 5 merely in that the trench-type cutout AN leads through below the terminal pads AF. In this embodiment, it is advantageous if the surface of the protection element terminates flush with the surface of the main body GK, since the terminal pads AF subsequently have to be applied across both surfaces.

In the figures described, the protection element SE is illustrated as an element embodied in a rather planar manner with a relatively small height. According to the invention, said element can also be embedded in the main body in different orientations than those illustrated and can be oriented there e.g. edgewise, such that it is perpendicular to the surface.

Figure 7:
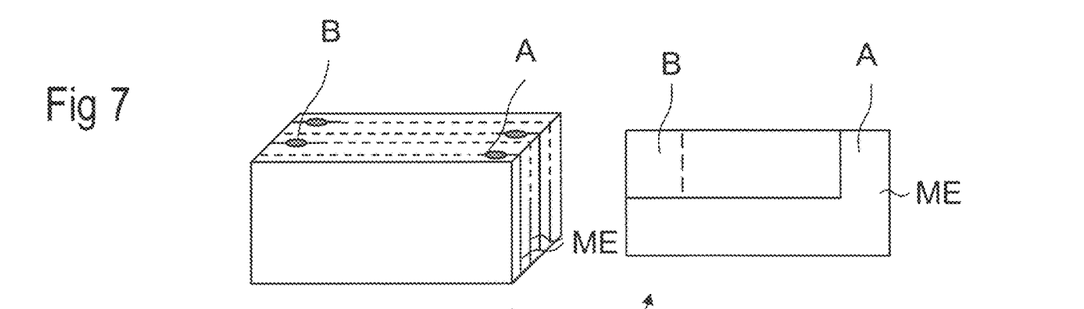
FIG. 7 shows a protection element in a perspective view and in cross section.

FIG. 7 shows, on the left-hand side, a schematic perspective illustration of a protection element SE, which is configured for example as a varistor. The varistor protection element SE has a multilayer construction in which layers of varistor ceramic are arranged between structured metal planes ME serving as electrode planes. The metal planes ME are alternately connected to electrical terminals A and B, which are led to a surface of the protection element SE.

In the embodiment illustrated, the metal planes ME are arranged vertically and the contacts are fitted on that side of the protection element SE at which the metal planes intersect the surface. The right-hand part of the illustration illustrates two electrode planes in plan view. The metal planes can be structured such that in the vicinity of an edge of the protection element SE they intersect the surface thereof and are to be connected to the contact A there, while on the same surface in the vicinity of the opposite edge only metal planes which are connected to the contact B intersect the surface. This facilitates the contacting of the two-pole component. However, the electrical terminals of the protection element SE can also be connected to the metal planes ME in a different way.

Figure 8:
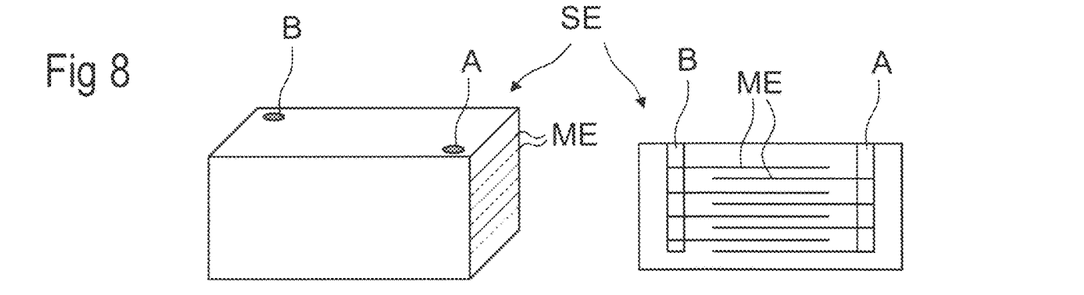
FIG. 8 shows a protection element in a perspective view and in cross section with altered orientation by comparison with FIG. 7.

FIG. 8 shows an arrangement of a multilayered protection element SE, for example of a varistor, in which the metal planes ME extend transversely with respect to the surface with the terminals A and B and are aligned parallel to the surface of the carrier plate in the later securing in the main body GK. The right-hand part of FIG. 8 again illustrates a cross section through protection element SE and metal planes ME. It becomes clear from the figure that the metal planes ME are connected alternately to a type of plated-through hole or a collective contact which connects all metal planes ME connected thereto to a respective terminal A, B on the top side of the protection element SE.

Figure 9A:
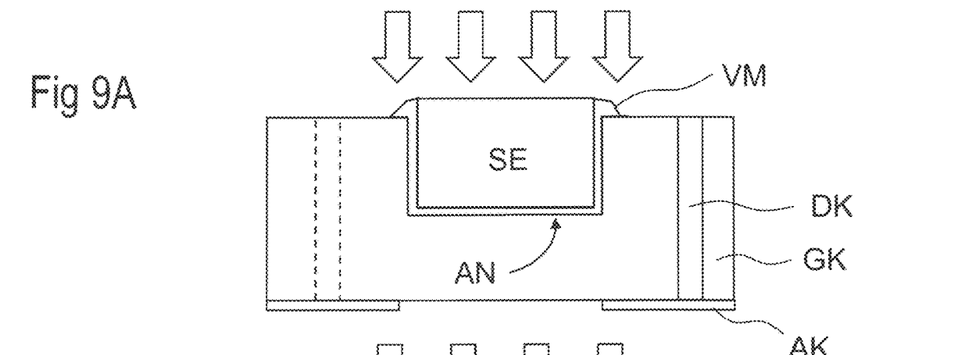
FIGS. 9A and 9B show the carrier plate in a method stage after the fixing of the protection element in the cutout, such as can be obtained in two different method variants.

FIG. 9A shows one embodiment of the invention on the basis of a schematic cross section through a carrier plate during one method stage in the course of production. The main body GK of the carrier plate has already been provided with plated-through holes DK that connect an upper orifice on the top side to a lower orifice on the underside of the main body GK. Already in an early method stage, on the underside it is possible to apply external contacts AK over the plated-through holes.

A cutout AN is then produced in the top side of the main body GK, said cutout having a cross section that is intrinsically arbitrary, but preferably corresponds to the external dimensions of the protection element SE. With the aid of a connection means VM, a protection element SE is then positioned in the cutout AN such that it does not project or projects only slightly beyond the surface of the main body GK. A connection means VM introduced into the cutout AN, for example, is displaced upon the insertion of the protection element SE and can emerge upward from the joint and form a bead there as illustrated in the figure.

Figure 9B:
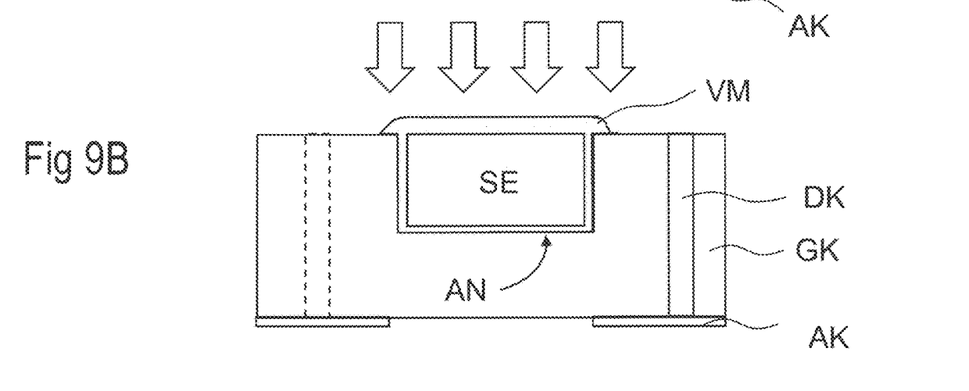

FIG. 9B shows a corresponding arrangement, wherein, although the protection element SE is embedded more deeply in the cutout AN, in return residues of connection means VM project beyond the surface of the main body GK. Such a configuration is also obtained if the protection element SE is fixed in the cutout AN with connection means at only a few points and only afterward are the remaining joints filled with connection means.

In the next step, a planar surface is created, wherein, with the aid of a material removal process represented by arrows in FIG. 9, the surface is mechanically processed and planarized in the process. Purely mechanical grinding away or chemically supported mechanical polishing (CMP) can be used for this purpose. Alternatively, the surface can also be made planar by milling.

Figure 10:
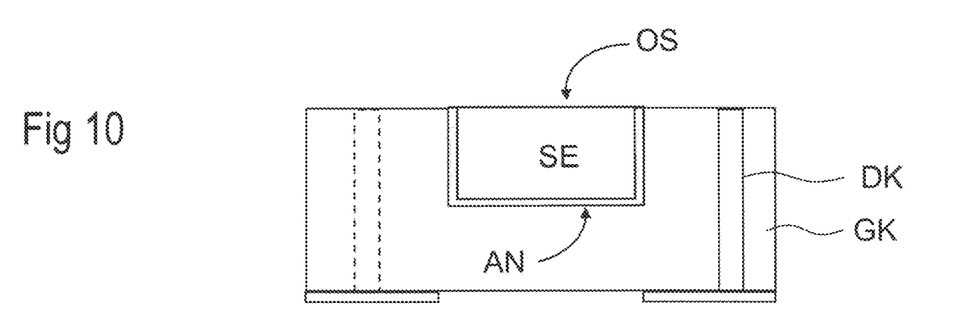
FIG. 10 shows the arrangement after a processing step for planarizing the surface.

FIG. 10 shows the arrangement after such a planarization of the surface, wherein the top side of the protection element SE terminates in a planar fashion and flush with the top side of the main body GK, and wherein the connection means also does not project or swell beyond the joint between protection element SE and main body.

After the application of the connection means VM, which is advantageously used in pasty or liquid form, a hardening process can subsequently take place or be actively carried out in order, firstly, to ensure the mechanical fixing of the protection element SE in the main body and in order, secondly, to convert the formerly liquid or pasty connection means VM into a hardened state which is sufficiently stable vis-à-vis later method steps for further processing and in particular during the application of contact pads and the soldering of components.

In the next step, a structured metallic layer SM is applied on the top sides of the main body and of the protection element SE and is structured such that it connects later terminal pads AF of the carrier plate to electrical terminals of the protection element SE. Since the protection element SE usually has two poles and the terminal pads AF connected thereto are also present in an even number, each terminal of the protection element SE can be connected to a terminal pad AF with the aid of the structured metallic layer SM. Alternatively, the structured metallic layer SM is structured such that it forms a terminal pad that respectively contacts a terminal of the protection element SE. Such an embodiment is illustrated for example in FIG. 11.

Figure 11:
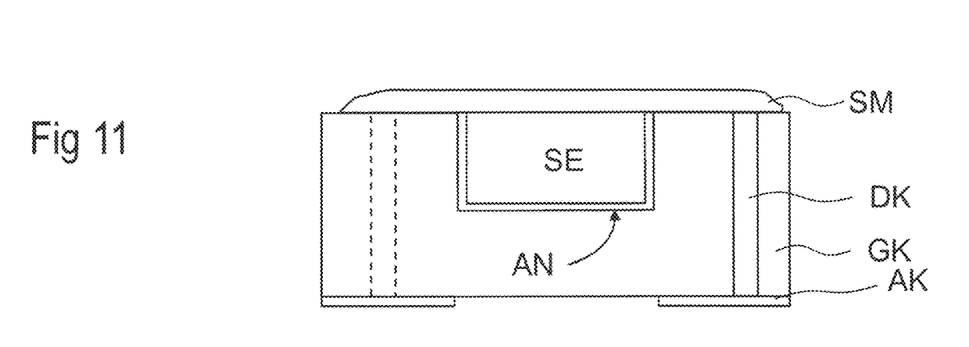
FIG. 11 shows the arrangement after the application of a structured metallization.

The structured metallic layer SM can be produced in the form of an electrically conductive paste which can be converted directly into an electrode layer having good conductivity by means of firing. It is also possible to apply metallic particles in the form of the smallest possible parts and to convert them into a continuous metal layer by heating. This method has the advantage that the melting can take place at significantly lower temperatures far below the actual melting point of the metallic layer, the metallic particles being converted into a material or a layer which can be caused to remelt only at a significantly higher temperature and therefore still remains stable even at higher temperatures.

It is also possible to form the structured metallic layer SM from a basic metallization which is able to be applied by way of the gas phase and which is subsequently reinforced with a metal having good electrical conductivity by means of an electrolytic or electroless method. In this regard, it is possible, for example, for gold or platinum, Ti, Cr, Cu, Ni, Ag or some other metal to be applied by sputtering in a thin layer and to be structured. The structuring can be effected by etching free or laser ablation of the regions that are not to be coated. It is also possible, however, to apply a mask on regions that are not to be coated. Said mask can be applied and structured before the production of the basic metallization, or only after the production of the basic metallization.

After the electrolytic or electroless reinforcement of the basic metallization, which results in a thickening of the structured metallic layer SM, it is possible to remove the mask together with overlying (lift-off method) or underlying basic metallization, with the result that a desired structuring is obtained, for example in the form of terminal pads and connection conductors to the terminals of the protection element SE. Arbitrarily conductive metals such as, for example, copper, nickel or else gold or palladium can be used for the electroless reinforcement.

Figure 12:
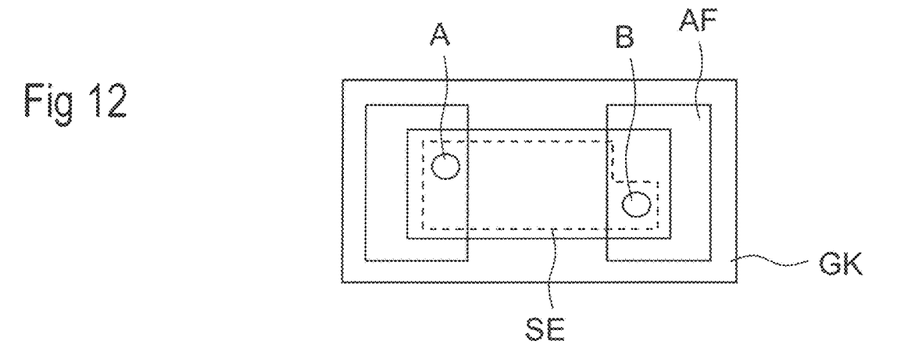
FIG. 12 shows a carrier plate in a schematic plan view.

FIG. 12 shows a schematic plan view of a carrier plate in which the terminal pads AF partly overlap the protection element SE, which is arranged below the terminal pads AF. By virtue of the overlap, an electrical contact with the terminals of the protection element is simultaneously produced.

The basic area of a metallization plane ME of the protection element SE, said metallization plane being connected to the terminal B, is indicated by the dashed line. The metallization planes are alternately connected to the terminals A and B of the protection element SE.

Figure 13:
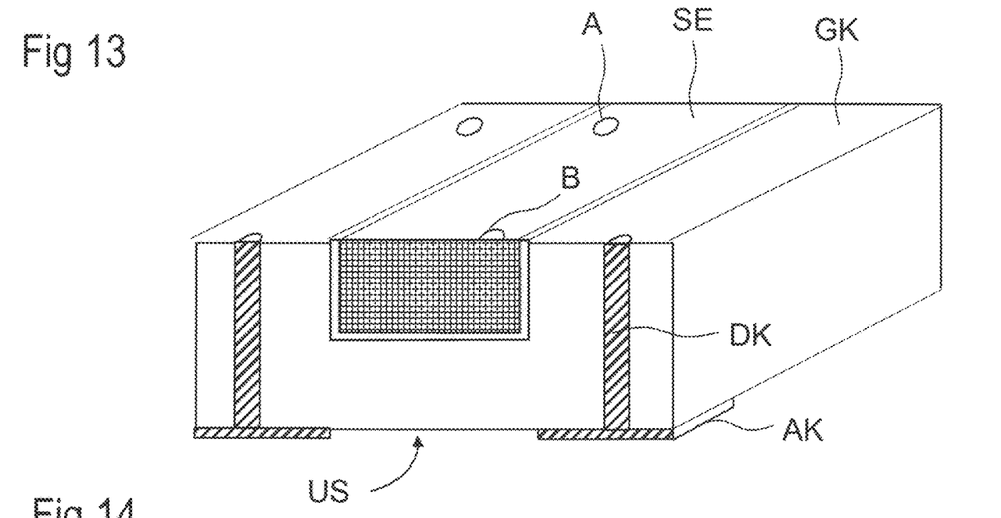
FIG. 13 shows a cross section through a carrier plate together with a schematic perspective view.

FIG. 13 shows, in a combined illustration, a cross section through a carrier plate at one method stage during production in accordance with FIG. 10, wherein the cross section is extended in perspective to form a three-dimensional illustration. The section is taken through the main body GK, the plated-through holes DK, the protection element SE and the terminal contacts AK. Electrical terminals A and B of the protection element SE are merely indicated in the perspective illustration. The plated-through holes DK electrically conductively connect the external contacts AK on the underside to the top side, where they are in turn contacted with the terminal pads AF in a later method step, not yet illustrated. After the application of a structured metallic layer, each of the terminals A, B of the protection element SE is connected to one of the two plated-through holes DK each assigned to a terminal pad. The external contacts AK constitute the bottom electrical terminal for the terminal pads AF arranged on the top side or for the protection element SE and the component to be mounted on the terminal pads AF later.

Figure 14:
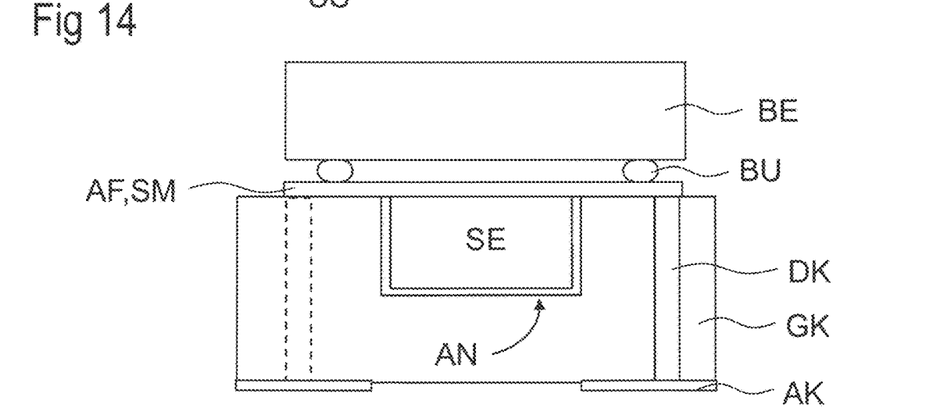
FIG. 14 shows a carrier plate with a component mounted thereon.

FIG. 14 shows, on the basis of a schematic cross section, a carrier plate in which an electrical component BE is mounted to the terminal pads AF, which can be formed from the structured metallic layer SM. A bump connection, for example, can be used as an electrically conductive connection between the terminals of the component and the terminal pad AF of the carrier plate. It is also possible for the component BE to be soldered on directly as an SMD component or to be contacted by means of an electrically conductive adhesive.

The component BE is an LED, for example, which is mounted on the surface of a ceramic main body, in which a varistor as protection element SE is embedded and connected to the terminal pads AF. The protection element SE is then connected in parallel with the terminals of the component BE and the LED, such that the latter is protected against high current surges such as may occur for example during an electrostatic discharge (ESD). The protection element SE can harmlessly dissipate current spikes in a current- or voltage-dependent manner, and produces a short circuit in the process, with the result that the component BE or the LED cannot be damaged by the overvoltage.

Since the invention was able to be illustrated only on the basis of a limited number of embodiments and figures, it is not restricted to the embodiments shown. In particular, the cutout can be arranged arbitrarily at the top side or underside of the main body GK or even extend through the entire main body. The cutout can be led to an arbitrary depth of the main body and is preferably dimensioned such that the mechanical stability of the main body is not detrimentally affected thereby. The number of terminal pads AF is preferably two, but can also be greater. A plurality of terminal pads can be connected to the same terminal of the protection element. It is also possible for terminal pads to be provided for more than one component and to be connected to the same protection element.

The structured metallic layer can be formed from an arbitrary material comprising electrically conductive metal and can be formed as a sole connection to the terminal pad or as a combined connection and terminal pad or solely as a terminal pad in direct contact with the terminals of the protection element.

The number of plated-through holes DK corresponds at least to the number of terminal pads which are provided and connected to the protection element SE, but is preferably chosen to be greater in order to ensure a low-loss or lossless electrical connection of top side and underside of the carrier plate.

The protection element can be embedded into the cutout with an accurate fit and completely fill the joint with the aid of the connection means VM. It is also possible, however, to fix the protection element SE at just a few points. In a later processing step the remaining joint can be filled with an arbitrary filling material, in particular with an insulating material and for example with a moldable compound. This can take place during the later encapsulation of a component in accordance with FIG. 14 or else already have taken place beforehand before the application of the terminal pad or the soldering of the component.

The main body can be embodied such that it is parallelepipedal and flat. The main body can have a plurality of component regions, only one of which in each case is illustrated in the figures, which component region corresponds to exactly one carrier for one component BE. However, a carrier can also carry a plurality of components BE or have terminal pads for a plurality of components. It is possible to provide one protection element per component. It is also possible, however, to interconnect a plurality of components in parallel with one protection element.

LIST OF REFERENCE SIGNS

A, B Terminals of the protection element
AF Terminal pads on top side of the main body
AK External contacts on underside of the main body
AN Cutout
BE Electrical component
BU Bump
DK Plated-through hole
GK Main body having
ME Wiring plane/metallization plane/metal layer
OS Top side of the main body
SE Protection element
SM Structured metallic layer
TP Carrier plate, possibly able to be singulated into carriers
US Underside of the main body
VM Connection means

The invention claimed is:

1. A carrier plate for an electrical component
comprising a mechanically stable main body, having external contacts on the underside and terminal pads for the component on the top side,
comprising a cutout, into which an ESD protection element is at least partly embedded, wherein the electrical terminals of the protection element are accessible from the top side of the main body,
wherein the protection element is mechanically fixedly embedded in the cutout of the main body by means of a connection means, the protection element being discrete from the main body and including an interspace between the protection element and the outer walls of the cutout,
wherein the electrical terminals of the protection element are connected by way of a structured metallic layer to the terminal pads on the top side,
wherein the main body is a crystalline, ceramic or vitreous main body,
wherein an outwardly facing surface of the protection element terminates flush with a surface of the main body, and
wherein the structured metallic layer bears on the two flush surfaces.

2. The carrier plate according to claim 1,
wherein the protection element is a varistor, a zener diode, a TVS component or some other nonlinear element.

3. The carrier plate according to claim 1,
wherein the connection means comprises a plastic or a ceramic material, glass or a metal.

4. The carrier plate according to claim 1,
wherein the external contacts and the terminal pads are electrically connected via plated-through holes,
wherein the main body has a multilayer construction
in which a wiring plane is provided internally in the main body.

5. The carrier plate according to claim 1,
wherein the cutout is arranged between the terminal pads for the component or therebelow,
wherein the protection element is recessed in the main body to a depth such that the component can be applied at least partly above the protection element.

6. The carrier plate according to claim 1,
wherein the cutout is configured in the form of a trench extending transversely over the main body.

7. The carrier plate according to claim 1,
wherein the cutout is laterally enclosed by the main body,
wherein the cutout extends vertically through the entire main body.

8. The carrier plate according to claim 1,
on which a multiplicity of component regions having terminal pads and at least one cutout in each case are provided,
wherein the carrier plate is able to be singulated into individual carriers, on each of which a component region for one or a plurality of components is provided.

9. A carrier plate for an electrical component
comprising a mechanically stable main body, having external contacts on the underside and terminal pads for the component on the top side,
comprising a cutout, into which an ESD protection element is at least partly embedded, wherein the electrical terminals of the protection element are accessible from the underside of the main body, the protection element being discrete from the main body and including an interspace between the protection element and the outer walls of the cutout,
wherein the protection element is mechanically fixedly embedded in the cutout of the main body by means of a connection means,
wherein the electrical terminals of the protection element are connected by way of a structured metallic layer to the terminal pads on the external contacts on the underside,
wherein the main body is a crystalline, ceramic or vitreous main body,
wherein the outwardly facing surface of the protection element terminates flush with a surface of the main body, and
wherein the structured metallic layer bears on the two flush surfaces.

* * * * *